United States Patent [19]

Mori et al.

[11] 4,381,202
[45] Apr. 26, 1983

[54] SELECTIVE EPITAXY BY BEAM ENERGY AND DEVICES THEREON

[75] Inventors: Haruhisa Mori, Yokohama; Tsutomu Ogawa, Tokyo; Takashi Matsumoto, Kawasaki, all of Japan

[73] Assignee: Fujitsu Limited, Kawasaki, Japan

[21] Appl. No.: 247,376

[22] Filed: Mar. 25, 1981

[30] Foreign Application Priority Data

Mar. 27, 1980 [JP] Japan .................. 55-39288

[51] Int. Cl.³ .................. H01L 21/263; H01L 21/265
[52] U.S. Cl. .................. 148/1.5; 29/576 B; 148/187; 357/91; 427/53.1
[58] Field of Search ............ 148/1.5, 187; 29/576 B; 427/53.1; 357/91

[56] References Cited

U.S. PATENT DOCUMENTS

| | | | |
|---|---|---|---|
| 4,072,545 | 2/1978 | De La Moneda | 148/187 |
| 4,101,350 | 7/1978 | Possley | 148/175 |
| 4,187,126 | 5/1980 | Radd et al. | 148/1.5 |
| 4,229,232 | 10/1980 | Kirkpatrick | 148/1.5 |
| 4,240,843 | 12/1980 | Celler et al. | 148/1.5 |
| 4,269,631 | 5/1981 | Anantha et al. | 148/1.5 |
| 4,292,091 | 9/1981 | Togei | 148/1.5 |

FOREIGN PATENT DOCUMENTS

WO80/00510 3/1980 PCT Int'l Appl.

OTHER PUBLICATIONS

Celler et al., Appl. Phys. Letts., 32 (1978) 464.
Anantha et al., IBM-TDB, 22 (1979) 575.
Lau et al., Appl. Phys. Letts. 33 (1978) 130.
Kamins et al., IEEE-Trans. Electron Devices, ED-27 (Jan. 1980) 299.

Primary Examiner—Upendra Roy
Attorney, Agent, or Firm—Staas & Halsey

[57] ABSTRACT

A semiconductor device in which an insulating layer having a window is formed on a semiconductor substrate, a semiconductor layer is formed on the insulating layer and a semiconductor element is formed on the semiconductor layer, has the advantages of high-speed operation and low power consumption. A conventional manufacturing method involves a high-temperature, time-consuming step by which the semiconductor layer for forming thereon the semiconductor element is formed so that it may have a proper impurity concentration. In the present invention, however, a portion of the semiconductor layer and a portion of the underlying substrate are rendered molten by annealing with an energy beam as of a laser, by which an impurity contained in the substrate is diffused into the semiconductor layer. Accordingly, no high-temperature, time-consuming step is involved in the present invention, permitting the production of a semiconductor device of excellent characteristics.

5 Claims, 6 Drawing Figures

SELECTIVE EPITAXY BY BEAM ENERGY AND DEVICES THEREON

BACKGROUND OF THE INVENTION

1. Field of the Invention

The present invention relates to a method for the manufacture of a semiconductor device, and more particularly to improvement in or relating to a method for the manufacture of a semiconductor device of the type having a BOMIS (Buried Oxide MIS) field effect transistor.

2. Description of the Prior Art

A known BOMIS field effect transistor has such a structure as shown in FIG. 1.

In FIG. 1, reference numeral 1 indicates a p type low resistance silicon semiconductor substrate having a resistivity $\rho_b$ of, for example, 1 to 2 $\Omega$·cm; 2 designates a silicon dioxide ($SiO_2$) film; 3S identifies a single crystalline silicon semiconductor layer; 3P denotes a polycrystalline silicon semiconductor layer; 4 represents another silicon dioxide film; 5 shows a gate oxide film; 6 refers to a silicon gate electrode; 7 indicates a source region; 8 designates a drain region; 9 identifies a phosphosilicate glass film; 7a denotes a source electrode; and 8a represents a drain electrode.

Such a semiconductor device is manufactured by such a method as described below.

The manufacture starts with the formation of a silicon dioxide film 2 to a thickness of about 1 $\mu$m on a p type low resistance (for example, resistivity $\rho_b \approx$ 1 to 2 $\Omega$·cm) silicon semiconductor substrate 1 through the use of the thermal oxidation method.

The silicon dioxide film 2 is subjected to patterning by ordinary photolithography to form therein a window, through which is exposed a portion of the surface of the single crystal silicon substrate 1.

Then, a silicon semiconductor layer is formed by the epitaxial growth method to cover the silicon dioxide layer 2 and the exposed substrate surface. In this case, the silicon semiconductor layer is composed of a single crystalline silicon semiconductor layer 3S formed on the exposed surface of the single crystal substrate 1 and a polycrystalline silicon semiconductor layer 3P formed on the silicon dioxide film 2. During the growth of the silicon semiconductor layer, an impurity in the substrate 1 is caused to diffuse out therefrom into the single crystalline silicon semiconductor layer 3S to make it p$^-$ type. The silicon semiconductor layers 3S and 3P are respectively formed about 1 $\mu$m thick.

Following this, the polycrystalline silicon semiconductor layer 3P is partly oxidized to form a silicon dioxide film 4 of about 1 $\mu$m in thickness, by means of selective thermal oxidation using, for example, a silicon nitride ($Si_3N_4$) film as a mask. In this case, the portion of the polycrystalline silicon semiconductor layer 3P to be selectively oxidized is usually etched shallow, prior to the thermal oxidation, so that the surfaces of the silicon dioxide film 4 to be formed and the polycrystalline silicon semiconductor layer 3P may be substantially flush with each other.

After removing the mask of the silicon nitride film, a thin silicon dioxide film is formed by thermal oxidation to extend on the silicon semiconductor layers 3S and 3P and a polycrystalline silicon layer is formed by chemical vapor deposition on the abovesaid thin silicon dioxide film.

Thereafter, the abovesaid polycrystalline silicon layer and thin silicon dioxide film are subjected to patterning by the ordinary photolithography, forming a gate oxide film 5 and a silicon gate electrode 6.

After this, for example, arsenic ions ($As^+$) are injected by ion implantation to form an n$^+$ type source region 7 and an n$^+$ type drain region 8, while at the same time rendering the silicon gate electrode 6 n$^+$ type. The sheet resistance $\rho_s$ of each of the portions thus made n$^+$ type is 10 to 20 $\Omega/\square$.

Next, a phosphosilicate glass film 9 is formed 0.8 $\mu$m or more thick by the chemical vapor deposition and then the film 9 is patterned by the ordinary photolithography to provide a windows for contact with the electrodes.

Thereafter, an electrode metal film is formed and then patterned to form a source electrode and wire 7a and a drain electrode and wire 8a, and further, an insulating film (not shown) is formed which serves as a surface protecting film; thus, a device is completed.

The above manufacturing process employs, for imparting the p$^-$ conductivity type to the single crystalline silicon semiconductor layer 3S, the out-diffusion of an impurity from the substrate 1 during the epitaxial growth. This method is desirable from the viewpoint of reducing the number of manufacturing steps involved on the one hand but has demerits on the other hand. Namely, since it is necessary to perform the out diffusion of an impurity simultaneously with the epitaxial growth of the silicon semiconductor layer, the step therefor requires a high temperature and much time. Accordingly, this step greatly affects the manufacturing cost of the device and causes warping of the substrate and a crystal defect.

With the present semiconductor technology, it will be possible to impart a suitable impurity concentration to the single crystalline silicon semiconductor layer 3S by doping it with an impurity during the growth of the aforesaid silicon semiconductor layer; with this method, however, the impurity concentration is difficult to control and, in obtaining a proper impurity concentration, there is a problem in terms of reproducibility. Further it is also possible to dope an impurity by the ion implantation after the growth of the silicon semiconductor layer but, in this case, too, high-temperature and time-consuming annealing is required and such annealing is an obstacle to the fabrication of a device with high integration density.

SUMMARY OF THE INVENTION

It is an object of the present invention to provide a semiconductor device manufacturing method in which a semiconductor layer formed on a semiconductor substrate containing an impurity is irradiated by an energy beam to melt a portion of the semiconductor substrate as well as the semiconductor layer, whereby the impurity in the semiconductor substrate is diffused into the semiconductor layer, making unnecessary such a high-temperature, time-consuming thermal diffusion step as involved in the prior art and providing a semiconductor device of excellent characteristics.

DESCRIPTION OF THE PREFERRED EMBODIMENTS

Figure 1:
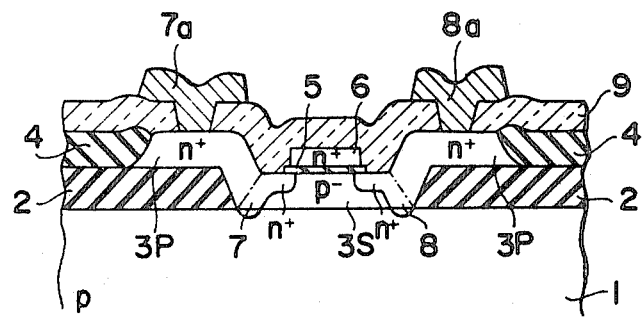
FIG. 1 is an enlarged sectional view showing the principal part of a semiconductor device, explanatory of a prior art example.
Figure 2:
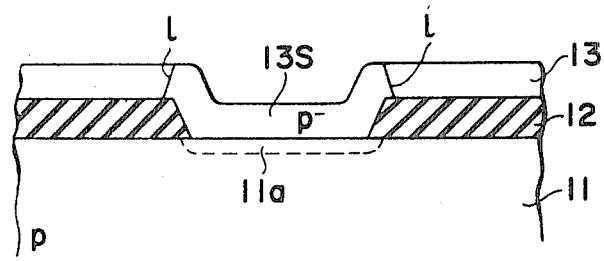
FIG. 2 is an enlarged sectional view illustrating the principal part of a semiconductor device in an important one of steps involved in its manufacture, explanatory of an embodiment of the present invention.

Referring first to FIG. 2, an embodiment of the manufacturing method of the present invention will be described in detail.

A first, a silicon dioxide film 12 of about 1 μm thick is formed by thermal oxidation on the top surface of a p type silicon semiconductor substrate 11 and the silicon dioxide film 12 is subjected to patterning to form therein a window as in the prior art.

Next, a silicon semiconductor layer 13 is formed, for example, approximately 5000 Å on the semiconductor substrate 11 by the chemical vapor deposition using monosilane (SiH$_4$) as a silicon source and decomposing the monosilane at 400° to 900° C. When grown at such low temperatures, silicon becomes polycrystalline. In this case, it is also possible to form an amorphous silicon layer by evaporation as required.

Then, the silicon semiconductor layer 13 overlying the window of the silicon dioxide film 12 and the underlying semiconductor substrate 11 are once partly molten by irradiation with photon beam such as laser beam and then solidified. The irradiation may be carried out with an electron beam or ion beam instead of the laser beam. When the molten portion of the silicon semiconductor layer 13 is solidified, epitaxial growth takes place on that portion by the influence of the substrate 11 which is single crystalline, resulting the molten portion becoming single crystalline. Namely, the portion which will ultimately form a part of each of channel, source and drain regions becomes a single crystalline silicon semiconductor portion, which is identified by 13S in FIG. 2. The boundary between the single crystalline semiconductor portion 13S and the polycrystalline silicon semiconductor portion is indicated by solid lines 1. Reference numeral 11a shows that portion of the semiconductor substrate 11 which was molten shallow by the laser beam. By the way, when a part of the semiconductor substrate 11 is thus molten by the laser beam, the p type impurity contained in that part rapidly diffuses into the single crystal silicon semiconductor portion 13S to make it p$^-$ type uniformly. Incidentally, the diffusion speed of an impurity in a liquid form increases about several orders of magnitude over the speed of ordinary out diffusion. For example, the diffusion coefficient of arsenic (As) in liquid phase silicon is ∼10$^{-4}$ cm$^2$/sec, whereas in solid phase silicon it is 2 to 5×10$^{-13}$ cm$^2$/sec at 1200° C. and 2 to 3×10$^{-14}$ cm$^2$/sec at 1100° C.

The step of laser beam irradiation is followed by the same manufacturing steps as in the prior art, thus obtaining a BOMIS field effect transistor.

In the above embodiment, it is very easy to control the impurity concentration of the single crystalline silicon semiconductor portion 13S. That is, the amount of impurity diffusion can be controlled by a suitable selection of the laser energy density depending on the depth to which the semiconductor substrate 11 is molten. For instance, in the case where the impurity concentration of the semiconductor substrate 11 was 1×10$^{16}$ cm$^{-3}$ and the single crystalline silicon semiconductor portion 13S was 5000 Å in thickness, the impurity concentration of the single crystalline silicon semiconductor portion 13S could be made to be 1.7×10$^{15}$ cm$^{-3}$ and 2.9×10$^{15}$ cm$^{-3}$ by melting the semiconductor substrate 11 to depths of 6000 and 7000 Å, respectively. According to the present embodiment, the impurity concentration profile can be made reverse from that in an ordinary case, that is, the impurity concentration of a semiconductor can be made to increase inwardly. This is effective for preventing a punch through phenomenon between the source and drain of a MOS field effect transistor; accordingly, individual elements can be miniaturized, allowing ease in the fabrication of devices with high integration density.

Figure 6:
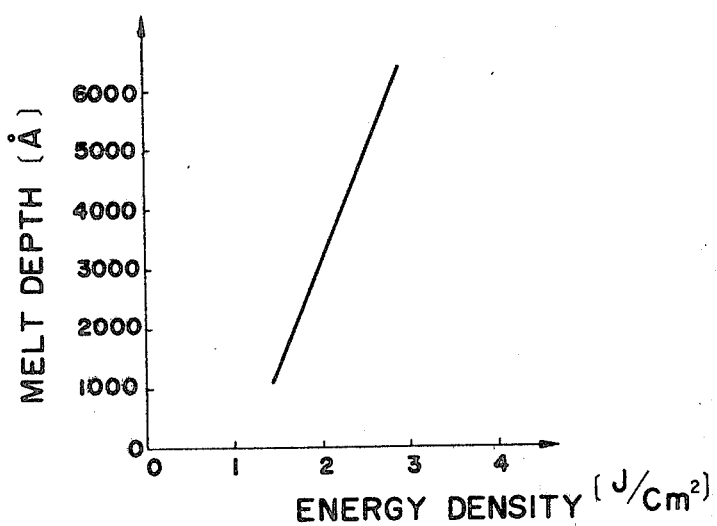
FIG. 6 is a graph showing the relationship between the laser energy density and melt depth.

The relationship between the energy density and the melt depth in the case of melting silicon by a laser beam of the Ruby laser in such as shown in FIG. 6. As will be seen from the graph, an energy density of ∼2.5 J/cm$^2$ is needed for melting the silicon to a depth of, for example, 5000 Å and ∼2.8 J/cm$^2$ is required for melting 6000 Å deep. Further, the accuracy of impurity concentration obtainable by 5 to 10 irradiations with laser beam pulses of the Ruby laser having an energy density of, for example, 2.5 J/cm$^2$ is ±10% or so.

Figure 3:
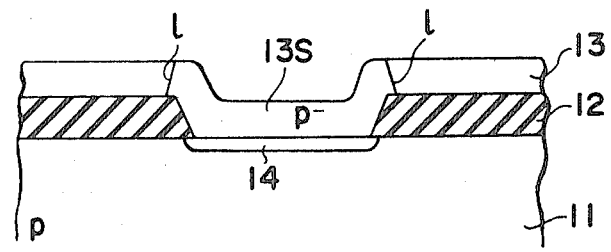
FIG. 3 is an enlarged sectional view illustrating the principal part of a semiconductor device in an important one of steps employed in its manufacture, explanatory of another embodiment of the present invention.

The impurity concentration of the single crystalline silicon semiconductor portion 13S can be controlled by another method, too, which will be described below with reference to FIG. 3. FIG. 3 is a schematic representation, similar to FIG. 2, of another embodiment of the present invention. This embodiment is identical with the foregoing embodiment in the step of forming the silicon dioxide film 12 on the surface of the substrate 11 and then forming a window in the silicon dioxide film 12. Thereafter, in this embodiment boron ions (B$^+$) are injected as by ion implantation into the exposed portion of the substrate 11 to form therein a p type region 14 of a predetermined impurity concentration and then the silicon semiconductor layer 13 is grown. And in the case of annealing by the laser beam irradiation, the melt depth of the semiconductor substrate 11 is held constant by maintaining the laser energy density at a fixed value. Consequently, the impurity concentration of the single crystalline silicon semiconductor portion 13S can be controlled depending on the impurity concentration of the p type region 14 formed by the ion implantation through the window of the silicon dioxide film 12.

Incidentally, the embodiment of FIG. 3 provides a structure which is unobtainable with the embodiment of FIG. 2. That is, by forming the polycrystalline silicon layer and performing the laser annealing after forming respective impurity regions by selectively injecting an n type or p type impurity through many windows formed in the silicon dioxide film 12, a p type and an n type single crystalline silicon semiconductor portion 13S can be obtained; accordingly, a complementary MIS field effect transistor can be constituted with much ease.

Moreover, by injecting an impurity of the same conductivity type through the windows of the silicon dioxide film 12 while selectively changing the quantity of the impurity for each window, the impurity concentration of the single crystalline silicon semiconductor portion 13S can be made to differ with the windows. Accordingly, it is possible to produce a MIS field effect transistor having threshold voltages Vth which differ according to the impurity concentrations, and an enhancement mode and a depletion mode MIS field effect transistor can be formed very easily.

With the embodiment described above in connection with FIG. 3, in the case where the dose of the impurity is $1 \times 10^{12}$ cm$^{-2}$ and the single crystalline silicon semiconductor portion 13S of a 4000 Å thickness and the semiconductor substrate 11 are molten to a depth of 1000 Å, an impurity concentration of $2 \times 10^{16}$ cm$^{-3}$ or so can be obtained. In this case, if the dose of the impurity is $2.5 \times 10^{11}$ cm$^{-2}$, an impurity concentration of $\sim 5 \times 10^{15}$ cm$^{-3}$ or so can be obtained.

In the embodiments of FIGS. 2 and 3, the Ruby laser is used but a CW laser may also be employed. In such a case, to meet various conditions of the embodiments, an Argon laser is adjusted to have a beam diameter of $\sim 100$ μm and an output of about 10 W or so; by scanning at a speed of 25 cm/sec, it is possible to obtain the same results as those obtainable with the Ruby laser.

Figure 4:
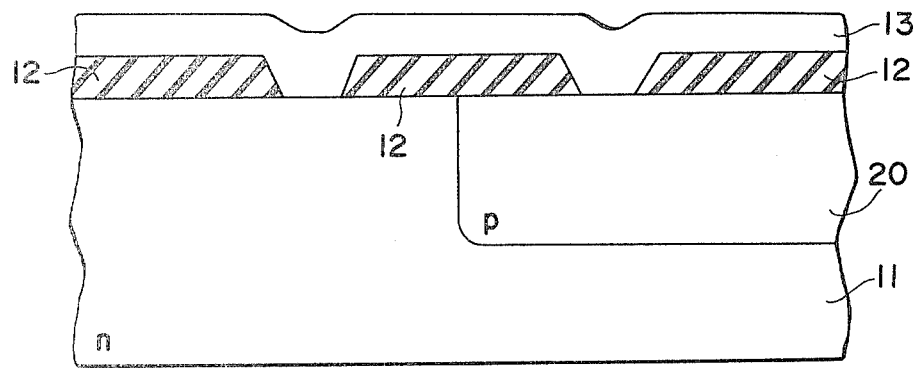
FIG. 4 is an enlarged sectional view illustrating the principal part of a semiconductor device in an important one of steps used in its manufacture, explanatory of still another embodiment of the present invention.
Figure 5:
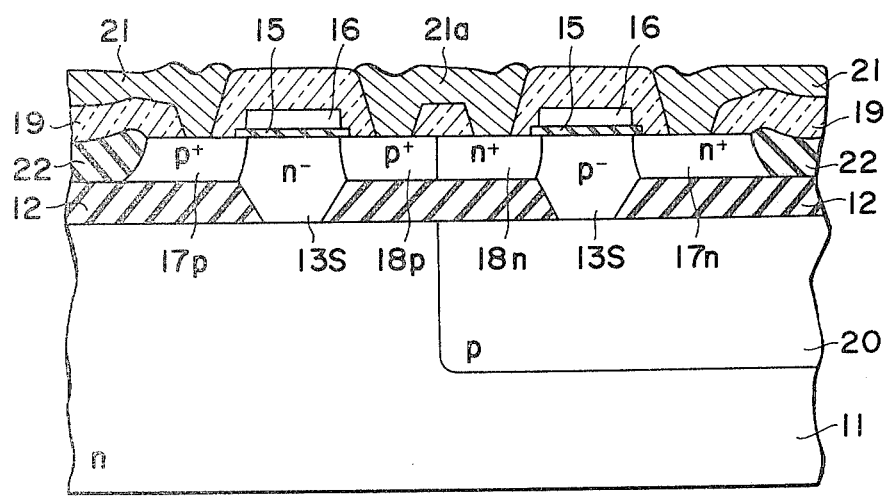
FIG. 5 is an enlarged sectional view showing the principal part of the semiconductor device of FIG. 4 in a manufacturing step employed after the step of FIG. 4.

A description will be given, with reference to FIGS. 4 and 5, of other embodiments of the present invention. At first, as shown in FIG. 4, a p type well region 20 is formed by an ordinary method in an n type silicon semiconductor substrate 11 and then a silicon dioxide film 12 is formed by thermal oxidation on the surface of the semiconductor substrate 11. The silicon dioxide film 12 is selectively removed by ordinary photolithography to form therein windows. Thereafter, properly using the aforesaid manufacturing method of the MIS field effect transistor, there are formed a p channel type MIS field effect transistor on the semiconductor layer 13 overlying the n type silicon semiconductor substrate 11 and an n channel type MIS field effect transistor on the semiconductor layer 13 overlying the p type well region, as shown in FIG. 5, thus constituting a complementary MIS field effect transistor. In this complementary MIS field effect transistor, a back gate bias can easily be applied via the p type well region 20 to that p$^-$ type region of the single crystalline silicon semiconductor portion 13S which serves as a channel region. The device of FIG. 5 has a complementary MIS field effect transistor structure which forms an inverter circuit. A field oxide film 22, a gate oxide film 15, a silicon gate electrode 16, an n$^+$ type source region 17n, an n$^+$ type drain region 18n, a p$^+$ type source region 17p, a p$^+$ type drain region 18p, a posphosilicate glass film 19 and an electrode-wire 21 are formed in the same manner as in the prior art.

As will be appreciated from the above, according to the present invention, since the polycrystalline silicon semiconductor layer which will ultimately serve as an active region is grown at a low temperature and in a short time as compared with the case of epitaxial growth, the defect and contamination by thermal strain are reduced, by which the yield of fabrication of devices and their reliability are increased. Further, when melting the polycrystalline silicon layer by laser irradiation, since the diffusion coefficient of an impurity in the liquid phase is very large, there can be obtained an impurity distribution uniform in the depthwise direction, by which impurity regions are formed in such a manner as of what is called self alignment. Moreover, since the device region is made single crystalline by laser annealing, it has few defects and a high carrier mobility, permitting high speed operation and high reliability of the device.

It will be apparent that many modifications and variations may be effected without departing from the scope of the novel concepts of this invention.

What is claimed is:

1. A method for the manufacture of a semiconductor device comprising the steps of:
    forming an insulating film on the surface of a semiconductor substrate having a predetermined conductivity type, the insulating film being selectively removed to form therein a window at a predetermined position;
    forming a semiconductor layer on the insulating film and the semiconductor substrate exposed through the window; melting the portion of the semiconductor layer corresponding to the window and the portion of the semiconductor substrate corresponding to the window by irradiation with an energy beam to a predetermined depth, by which an impurity in the semiconductor substrate is diffused into the semiconductor layer to impart thereto a predetermined conductivity type of relatively low impurity concentration and, at the same time, make monocrystalline at least that portion of the semiconductor layer corresponding to the window; and
    in the substrate is diffused into the semiconductor layer portion and the molten semiconductor layer portion is rendered to single crystalline.

2. A semiconductor device manufacturing method according to claim 1 wherein the semiconductor layer is a silicon semiconductor layer.

3. A semiconductor device manufacturing method according to claim 1 wherein the impurity concentration of the semiconductor layer portion is controlled by selecting the melt depth of the substrate.

4. A semiconductor device manufacturing method according to claim 1 wherein an impurity is introduced beforehand into the portion of the substrate corresponding to the window of the insulating layer.

5. A semiconductor device manufacturing method according to claim 1 wherein the energy beam is a selected from a photon beam, an electron beam and an ion beam.

* * * * *

UNITED STATES PATENT AND TRADEMARK OFFICE
CERTIFICATE OF CORRECTION

PATENT NO. : 4,381,202

DATED : Apr. 26, 1983

INVENTOR(S) : Mori et al.

It is certified that error appears in the above-identified patent and that said Letters Patent is hereby corrected as shown below:

Front page, [54] Title, line 2, after "DEVICES" insert --FORMED--;

Front page, [57] ABSTRACT, line 13, delete "rendered".

Column 6, line 29, begin new paragraph with "melting".

Signed and Sealed this

Sixth Day of September 1983

[SEAL]

Attest:

GERALD J. MOSSINGHOFF

Attesting Officer

Commissioner of Patents and Trademarks